(12) United States Patent
Liu et al.

(10) Patent No.: US 11,750,200 B2
(45) Date of Patent: Sep. 5, 2023

(54) PHASE-LOCKED LOOP CIRCUIT, CONFIGURATION METHOD THEREFOR, AND COMMUNICATION APPARATUS

(71) Applicant: ZTE Corporation, Shenzhen (CN)

(72) Inventors: Jun Liu, Shenzhen (CN); Zhaobi Wei, Shenzhen (CN); Shan Wang, Shenzhen (CN); Pei Duan, Shenzhen (CN); Mengbi Lei, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 17/624,063

(22) PCT Filed: Jun. 19, 2020

(86) PCT No.: PCT/CN2020/097225
§ 371 (c)(1),
(2) Date: Dec. 30, 2021

(87) PCT Pub. No.: WO2021/000751
PCT Pub. Date: Jan. 7, 2021

(65) Prior Publication Data
US 2022/0360267 A1    Nov. 10, 2022

(30) Foreign Application Priority Data
Jul. 2, 2019   (CN) .......................... 201910591540.4

(51) Int. Cl.
*H03L 7/081*   (2006.01)
*H03L 7/08*    (2006.01)
(Continued)

(52) U.S. Cl.
CPC ............... *H03L 7/081* (2013.01); *H03L 1/02* (2013.01); *H03L 7/0802* (2013.01); *H03L 7/10* (2013.01)

(58) Field of Classification Search
CPC ..... H03L 7/00; H03L 7/06; H03L 7/08; H03L 7/081; H03L 7/085; H03L 7/089; H03L 7/093
See application file for complete search history.

(56) References Cited

U.S. PATENT DOCUMENTS 4,679,005 A * 7/1987 Tatami .................... H03L 7/081
                                                              331/25
9,966,661 B2   5/2018 Xue et al.
(Continued)

FOREIGN PATENT DOCUMENTS

CN       1968006 A      5/2007
CN     101662260 A      3/2010
(Continued)

OTHER PUBLICATIONS

International Searching Authority. International Search Report and Written Opinion for PCT Application No. PCT/CN2020/097225 and English translation, dated Aug. 28, 2020, pp. 1-9.
(Continued)

*Primary Examiner* — Diana J. Cheng
(74) *Attorney, Agent, or Firm* — Vivacqua Crane, PLLC

(57) ABSTRACT

Provided is a phase-locked loop circuit, a method for configuring the same, and a communication device. The phase-locked loop circuit includes a phase-locked loop main circuit and a phase temperature compensation circuit. The phase temperature compensation circuit includes at least one phase delay unit connected to the phase-locked loop main circuit and configured to generate a phase shift as a result of a temperature change for cancelling out a phase shift generated by the phase-locked loop main circuit as a result of a temperature change.

10 Claims, 9 Drawing Sheets

(51) Int. Cl.
*H03L 7/10* (2006.01)
*H03L 1/02* (2006.01)

(56) References Cited

U.S. PATENT DOCUMENTS

| | | |
|---|---|---|
| 2010/0219894 A1 | 9/2010 | Rogers |
| 2015/0061781 A1 | 3/2015 | Shimura |

FOREIGN PATENT DOCUMENTS

| | | |
|---|---|---|
| CN | 104135277 A | 11/2014 |
| CN | 105629772 A | 6/2016 |
| CN | 108988854 A | 12/2018 |
| WO | 2006000611 A1 | 1/2006 |

OTHER PUBLICATIONS

European Patent Office. Extended European Search Report for EP Application No. 20835431.6, dated Jul. 5, 2022, pp. 1-9.

\* cited by examiner

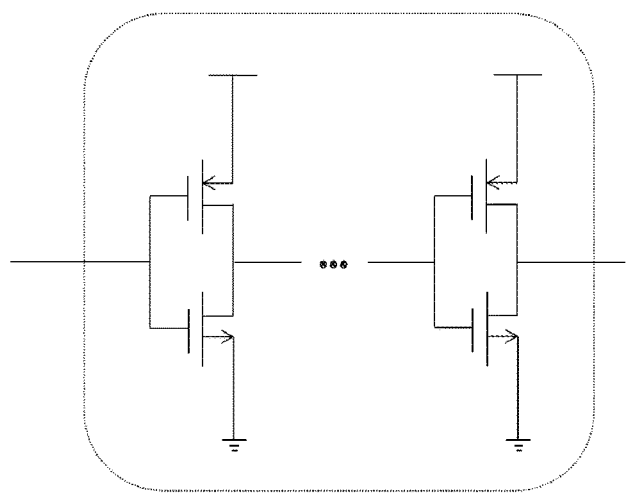
FIG. 7
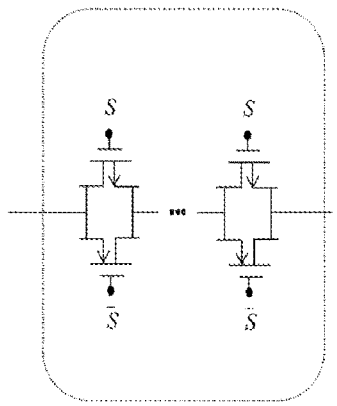 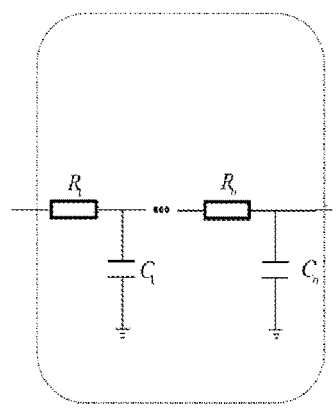 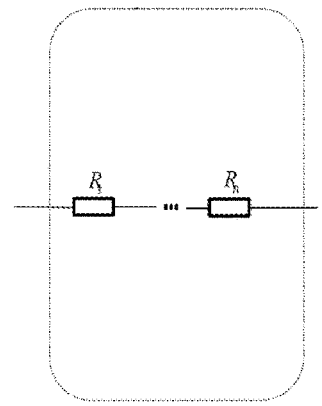
FIG. 8-1     FIG. 8-2     FIG. 8-3
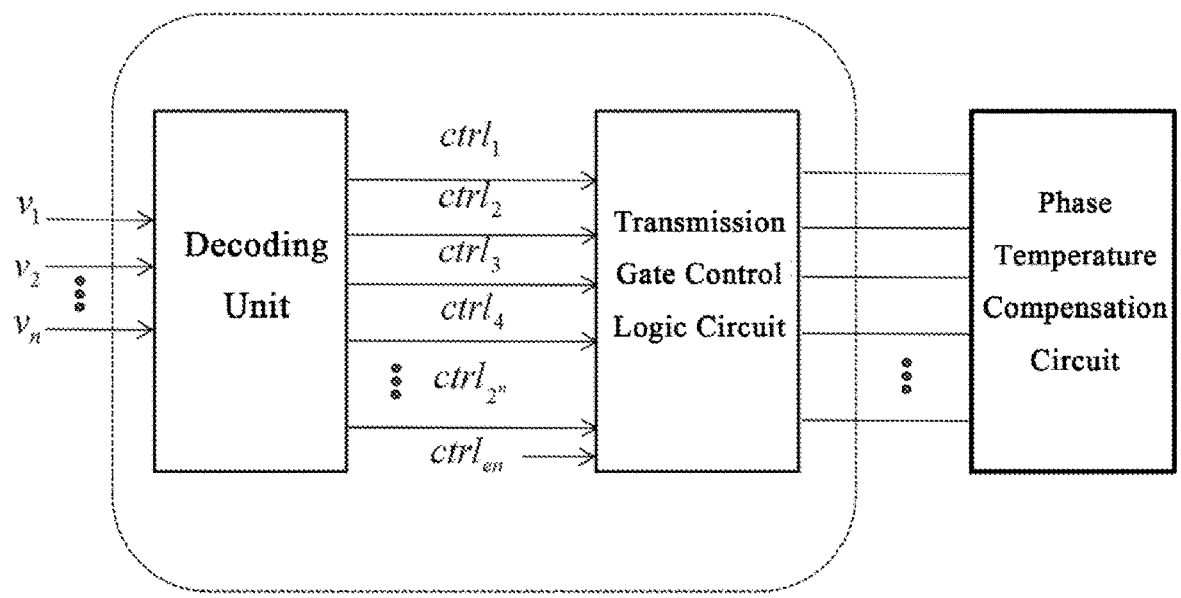
FIG. 9

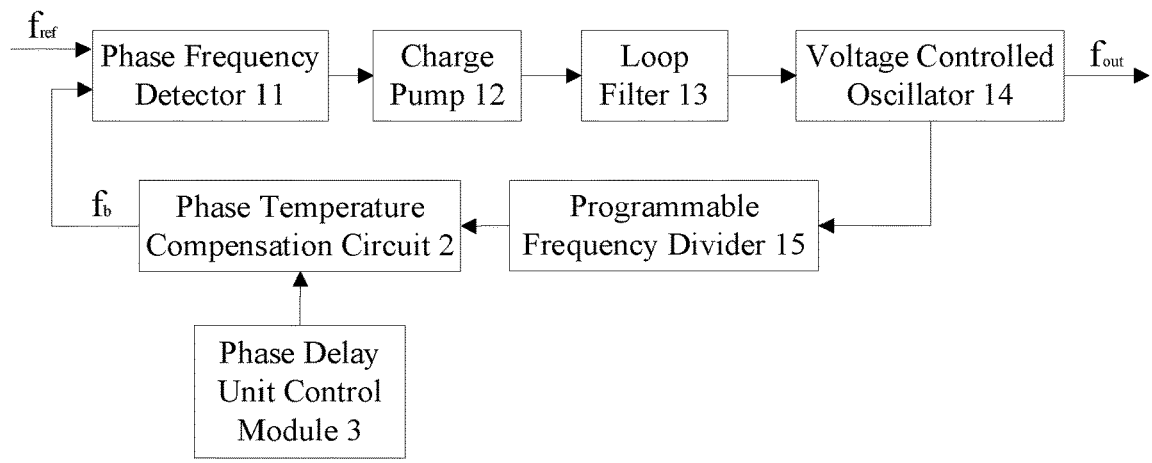
FIG. 13-1
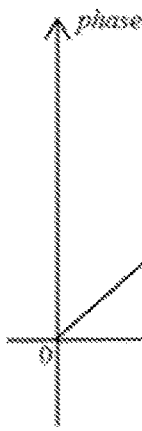 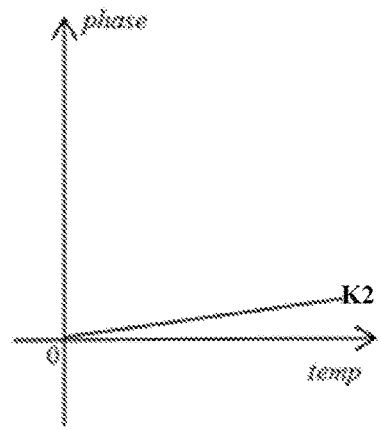 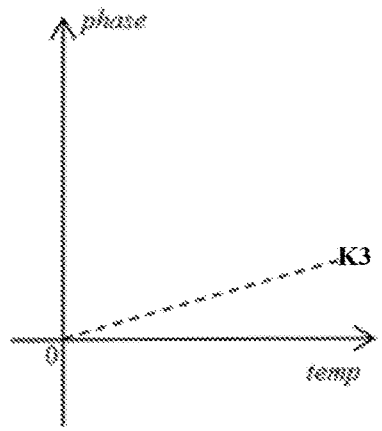
FIG. 13-2      FIG. 13-3      FIG. 13-4
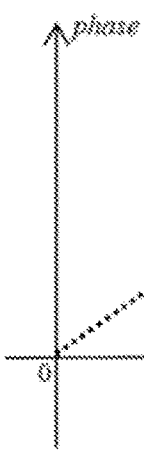 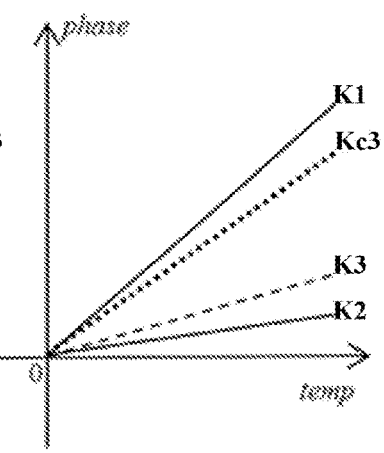 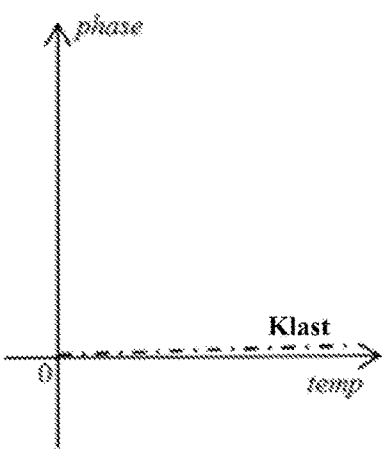
FIG. 13-5      FIG. 13-6      FIG. 13-7

 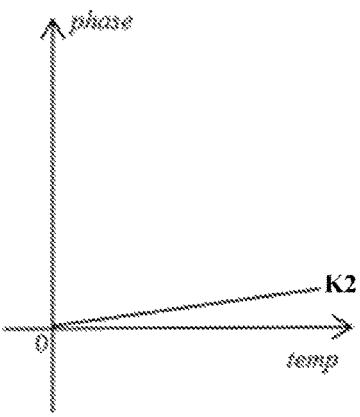 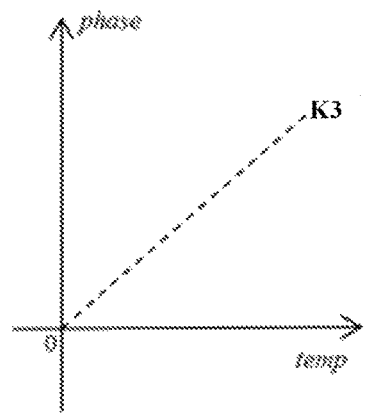
FIG. 15-1    FIG. 15-2    FIG. 15-3
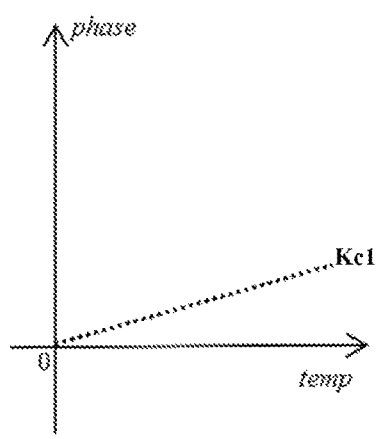 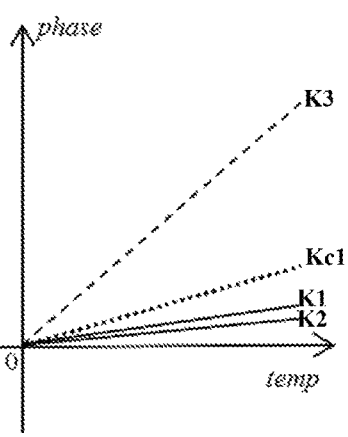 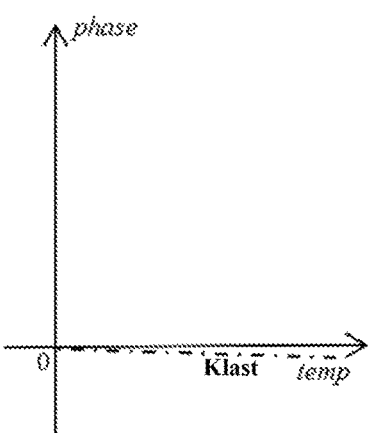
FIG. 15-4    FIG. 15-5    FIG. 15-6
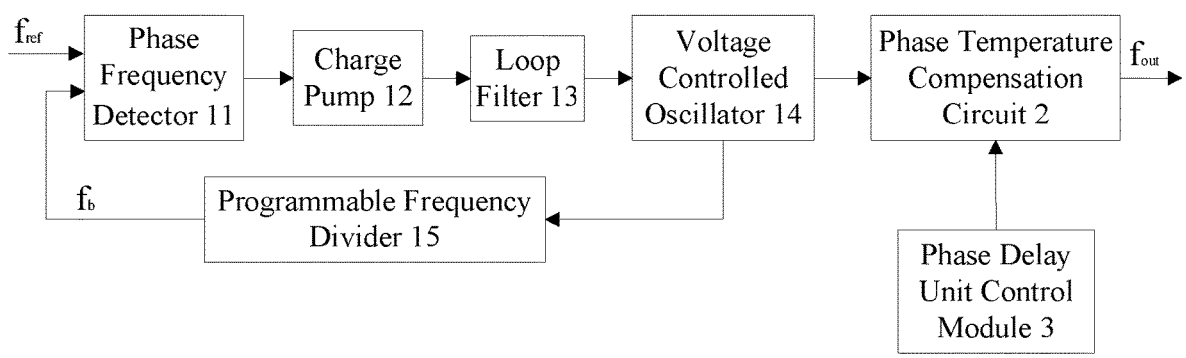
FIG. 16-1

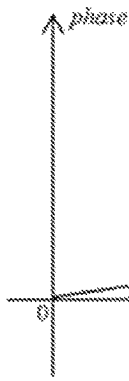
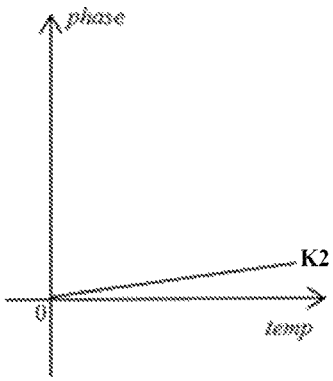
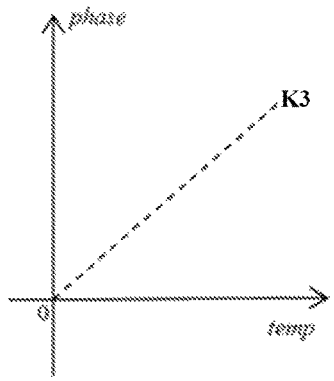
FIG. 16-2     FIG. 16-3     FIG. 16-4
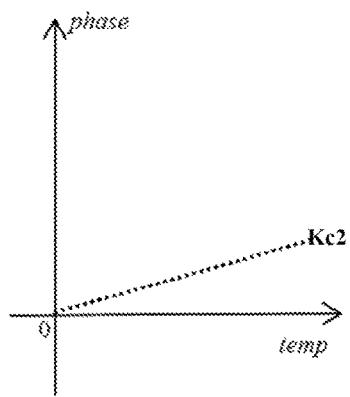
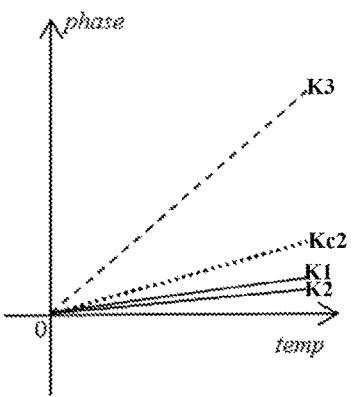
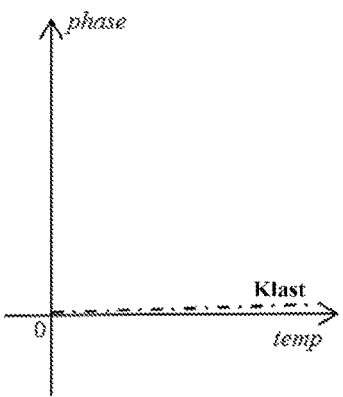
FIG. 16-5     FIG. 16-6     FIG. 16-7
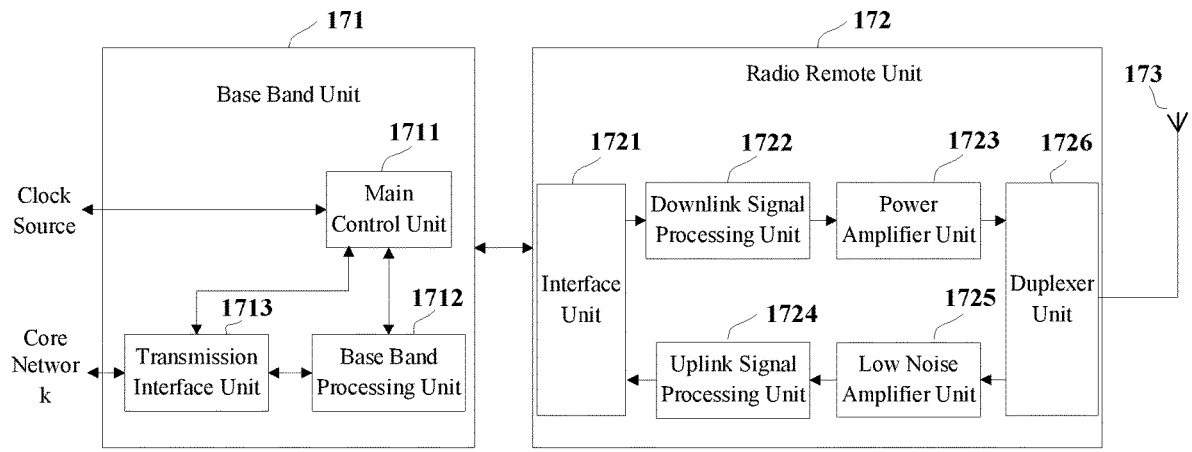
FIG. 17

PHASE-LOCKED LOOP CIRCUIT, CONFIGURATION METHOD THEREFOR, AND COMMUNICATION APPARATUS

CROSS-REFERENCE TO RELATED APPLICATION

This application is a national stage filing under 35 U.S.C. § 371 of international application number PCT/CN2020/097225, filed Jun. 19, 2020, which claims priority to Chinese patent application No. 201910591540.4, filed Jul. 2, 2019. The contents of these applications are incorporated herein by reference in their entirety.

TECHNICAL FIELD

The present disclosure relates to the technical field of communication, and in particular, to a phase-locked loop circuit, a method for configuring the same, and a communication device.

BACKGROUND

With the development of communication technologies, multi-array antenna base stations and multi-transceiver channel complete machines are typical applications of 4G and $5^{th}$ Generation (5G) communication technologies. In 5G communication, Space Division Multiple Access (SDMA) is an important example of Maximum Input Minimum Output (Massive MIMO) technology applications. SDMA uses a beamforming technology to concentrate signal energy in a specific direction for propagation so as to increase spectrum utilization efficiency and reduce interference with other receivers. Beamforming has strict requirements on a phase difference of signals between multiple channels of transceivers. For example, the phase difference between multiple channels of transceivers of a 5G base station of sub 6G should be less than 5°. Limited by costs and single-board area, generally one phase-locked loop circuit is used for each channel. Since the phase-locked loop circuit generates a phase shift with temperature change, a phase deviation between multiple channels increases as a result of the temperature change. In view of the problem, in order to meet a requirement that the phase difference between multiple channels is less than a set value (e.g. 5°), currently, a wireless base station system takes a series of phase detection and adjustment measures to reduce a phase error between channels, so as to align phases of multi-channel signals. For example, phase detection and alignment control are performed every 30 minutes. Such phase detection and alignment require a lot of system resources and large power consumption, and cannot guarantee that the phase difference between multiple channels within a detection time interval is less than the set value. Therefore, how to fundamentally guarantee multi-channel phase synchronization is a major technical bottleneck in base station application.

SUMMARY

According to the present disclosure provided is a phase-locked loop circuit, a method for configuring the phase-locked loop circuit, and a communication device to at least solve the problem described above.

According to an embodiment of the present disclosure, a phase-locked loop circuit is provided. The phase-locked loop circuit may include a phase-locked loop main circuit and a phase temperature compensation circuit. The phase temperature compensation circuit may include at least one phase delay unit connected to the phase-locked loop main circuit and configured to generate a phase shift as a result of a temperature change. The phase shift generated by the phase delay unit connected to the phase-locked loop main circuit as a result of a temperature change and a phase shift generated by the phase-locked loop main circuit as a result of a temperature change cancel each other out.

According to another embodiment of the present disclosure, a method for configuring the phase-locked loop circuit is further provided. The method may include: obtaining, by simulation, a phase shift generated by the phase-locked loop main circuit as a result of a temperature change; determining phase delay unit control parameters according to the phase shift; and controlling, according to the phase delay unit control parameters, connection of a corresponding number of phase delay units to the phase-locked loop main circuit.

According to yet another embodiment of the present disclosure, a communication device is further provided. The communication device may include at least one phase-locked loop circuit described above.

According to the phase-locked loop circuit, the method for configuring the phase-locked loop circuit, and the communication device provided by the present disclosure, the phase-locked loop circuit includes a phase-locked loop main circuit and a phase temperature compensation circuit. According to a phase shift generated by the phase-locked loop main circuit as a result of a temperature change, at least one phase delay unit of the phase temperature compensation circuit is connected into the phase-locked loop main circuit, and the connected phase delay unit of the phase temperature compensation circuit is configured to generate a phase shift generated by as a result of the temperature change to cancel out the phase shift generated by the phase-locked loop main circuit as a result of the temperature change. The circuit therefore ensures that the phase-locked loop circuit does not generate a phase shift as result of a temperature change or only generates a phase shift in a small range during operation. In this way, when the phase-locked loop circuit is applied to multi-channel scenarios, a phase difference between channels is minimized at all times since the temperature change causes no phase shift or only a phase shift in a small range in the phase-locked loop circuits of the channels during operation, thereby in a better way meeting the requirement of phase synchronization on multi-channel communication, fundamentally. Besides, phase detection and alignment control operations performed between channels can be canceled, which improves resource utilization and saves energy consumption as well.

Other features and corresponding beneficial effects of the present disclosure are explained in the later part of the description, and it should be understood that at least some of the beneficial effects become apparent from the description of the present disclosure.

BRIEF DESCRIPTION OF DRAWINGS

FIG. 7 is a schematic structural diagram one of a phase delay unit according to Embodiment II of the present disclosure;

FIG. 8-1 is a schematic structural diagram two of the phase delay unit according to Embodiment II of the present disclosure;

FIG. 8-2 is a schematic structural diagram three of the phase delay unit according to Embodiment II of the present disclosure;

FIG. 8-3 is a schematic structural diagram four of the phase delay unit according to Embodiment II of the present disclosure;

FIG. 9 is a schematic structural diagram of a phase delay unit control module according to Embodiment II of the present disclosure;

FIG. 11-1 is a schematic diagram of phase change with temperature in the case of uncompensation according to Embodiment II of the present disclosure;

FIG. 11-2 is a schematic diagram of undercompensation according to Embodiment II of the present disclosure;

FIG. 11-3 is a schematic diagram of overcompensation according to Embodiment II of the present disclosure;

FIG. 11-4 is a schematic diagram of ideal compensation according to Embodiment II of the present disclosure;

FIG. 13-1 is a schematic structural diagram of a phase-locked loop circuit in Application Scenario one according to Embodiment III of the present disclosure;

FIG. 13-2 is a schematic diagram of K1 of a reference signal input path in Application Scenario one according to Embodiment III of the present disclosure;

FIG. 13-3 is a schematic diagram of K2 of a signal output path in Application Scenario one according to Embodiment III of the present disclosure;

FIG. 13-4 is a schematic diagram of K3 of a feedback signal transmission path in Application Scenario one according to Embodiment III of the present disclosure;

FIG. 13-5 is a schematic diagram of Kc3 of a phase delay unit on the feedback signal transmission path in Application Scenario I according to Embodiment III of the present disclosure;

FIG. 13-6 is a schematic diagram of comparison in Application Scenario I according to Embodiment III of the present disclosure;

FIG. 13-7 is a schematic diagram of Klast in Application Scenario I according to Embodiment III of the present disclosure;

FIG. 14-1 is a schematic structural diagram of the phase-locked loop circuit in Application Scenario II according to Embodiment III of the present disclosure;

FIG. 14-2 is a schematic diagram of K1 of the reference signal input path in Application Scenario II according to Embodiment III of the present disclosure;

FIG. 14-3 is a schematic diagram of K2 of the signal output path in Application Scenario II according to Embodiment III of the present disclosure;

FIG. 14-4 is a schematic diagram of K3 of the feedback signal transmission path in Application Scenario II according to Embodiment III of the present disclosure;

FIG. 14-5 is a schematic diagram of Kc1 of the phase delay unit on the feedback signal transmission path in Application Scenario II according to Embodiment III of the present disclosure;

FIG. 14-6 is a schematic diagram of comparison in Application Scenario II according to Embodiment III of the present disclosure;

FIG. 14-7 is a schematic diagram of Klast in Application Scenario II according to Embodiment III of the present disclosure;

FIG. 15-1 is a schematic diagram of K1 of the reference signal input path in Application Scenario III according to Embodiment III of the present disclosure;

FIG. 15-2 is a schematic diagram of K2 of the signal output path in Application Scenario III according to Embodiment III of the present disclosure;

FIG. 15-3 is a schematic diagram of K3 of the feedback signal transmission path in Application Scenario III according to Embodiment III of the present disclosure;

FIG. 15-4 is a schematic diagram of Kc1 of the phase delay unit on the feedback signal transmission path in Application Scenario III according to Embodiment III of the present disclosure;

FIG. 15-5 is a schematic diagram of comparison in Application Scenario III according to Embodiment III of the present disclosure;

FIG. 15-6 is a schematic diagram of Klast in Application Scenario III according to Embodiment III of the present disclosure;

FIG. 16-1 is a schematic structural diagram of the phase-locked loop circuit in Application Scenario II according to Embodiment III of the present disclosure;

FIG. 16-2 is a schematic diagram of K1 of the reference signal input path in Application Scenario IV according to Embodiment III of the present disclosure;

FIG. 16-3 is a schematic diagram of K2 of the signal output path in Application Scenario IV according to Embodiment III of the present disclosure;

FIG. 16-4 is a schematic diagram of K3 of the feedback signal transmission path in Application Scenario IV according to Embodiment III of the present disclosure;

FIG. 16-5 is a schematic diagram of Kc2 of the phase delay unit on the feedback signal transmission path in Application Scenario IV according to Embodiment III of the present disclosure;

FIG. 16-6 is a schematic diagram of comparison in Application Scenario IV according to Embodiment III of the present disclosure;

FIG. 16-7 is a schematic diagram of Klast in Application Scenario IV according to Embodiment III of the present disclosure; and FIG. 17 is a schematic structural diagram of a base station according to Embodiment IV of the present disclosure.

DETAILED DESCRIPTION

In order to make the objectives, technical schemes and advantages of the present disclosure clearer, the present disclosure is described in further detail below through specific implementations in conjunction with the accompanying drawings. It should be understood that specific embodiments described herein are intended only to illustrate and not to limit the present disclosure.

Embodiment I

Figure 1:
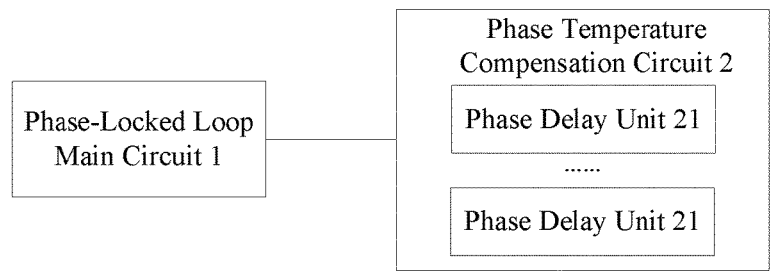
FIG. 1 is a schematic structural diagram of a phase-locked loop circuit according to Embodiment I of the present disclosure.

A phase-locked loop circuit has the characteristic of generating a phase shift as a result of a temperature change, leading to a gradual increase in a phase deviation between multiple channels using multiple phase-locked loop circuits as a result of the temperature change. In view of the problem, the present disclosure provides a phase-locked loop circuit that can fundamentally realize multi-channel phase synchronization. Referring to FIG. 1, a phase-locked loop circuit in this embodiment includes a phase-locked loop main circuit 1 and a phase temperature compensation circuit 2. The phase temperature compensation circuit 2 includes at least one phase delay unit 21 which is connected to the phase-locked loop main circuit 1. A phase shift generated by the phase delay unit 21 connected to the phase-locked loop main circuit 1 as a result of a temperature change and a phase shift generated by the phase-locked loop main circuit 1 as a result of a temperature change cancel each other out. This ensures that the phase-locked loop circuit does not generate a phase shift as result of a temperature change or only generates a phase shift in a small range during operation. In this way, when the phase-locked loop circuit is applied to multi-channel scenarios, a phase difference between channels is minimized at all times since a temperature change causes no phase shift or only a phase shift in a small range in the phase-locked loop circuits of the channels during operation, thereby better meeting a phase synchronization requirement on multi-channel communication fundamentally. Besides, detection and alignment control operations performed on phases between channels can be canceled, which improves resource utilization and saves energy consumption at the same time.

It is to be understood that, in some application scenarios of this embodiment, a corresponding number of phase delay units 21 of the phase temperature compensation circuit 2 that are to be connected to the phase-locked loop main circuit 1 may be set according to, but not limited to, the phase shift generated by the phase-locked loop main circuit 1 as a result of a temperature change, and their specific positions in the phase-locked loop main circuit 1 may also be flexibly set.

It is to be understood that, the phase-locked loop main circuit 1 in this embodiment may be a variety of circuits that can realize the function of the phase-locked loop main circuit. For ease of understanding, this embodiment is illustrated below with an exemplary phase-locked loop main circuit 1, but it is to be understood that the structure of the phase-locked loop main circuit 1 in this embodiment is not limited to the structure in the following example.

Figure 2:
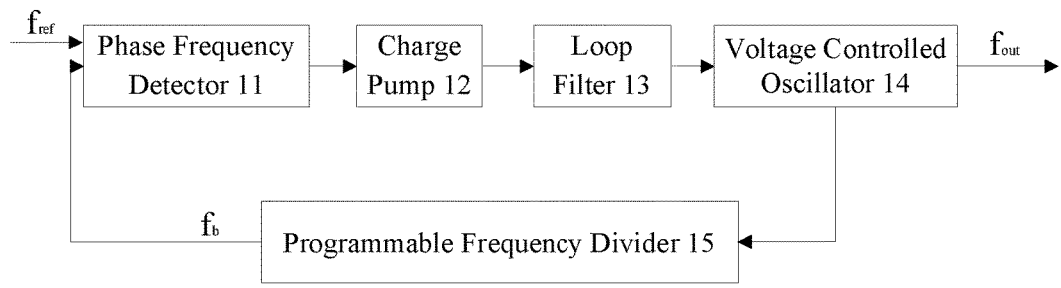
FIG. 2 is a schematic structural diagram of a phase-locked loop main circuit according to Embodiment I of the present disclosure.

Referring to FIG. 2, the phase-locked loop main circuit 1 in this example includes a phase frequency detector 11, a charge pump 12, a loop filter 13, a voltage controlled oscillator (VCO) 14, and a programmable frequency divider 15.

The phase frequency detector 11 is configured to detect a phase difference and a frequency difference between an external reference signal fref and a feedback signal fb outputted by the programmable frequency divider 15. An implementation circuit for the phase frequency detector 11 may be configured flexibly. In an example, the phase frequency detector 11 may include two D-edge triggers and an AND gate.

The charge pump 12 is configured mainly to convert a logic level representing phase difference information outputted by the phase frequency detector 11 into a current signal, and charge and discharge the loop filter 13 under the action of a control switch, causing a VCO tuning voltage Vtune on a capacitor of the loop filter 13 to increase or decrease.

In an example, the loop filter 13 may be, but not limited to, a passive filter. The loop filter 13 is configured to filter out high-frequency components of signals outputted by the charge pump 12, and output an approximate DC voltage Vtune as a control signal of the VCO. An implementation circuit of the loop filter 13 may also be set flexibly. In an example, the loop filter 13 may include a capacitor and a resistor.

The VCO 14 is a circuit module that controls an output oscillation frequency through a voltage signal inputted by the loop filter 13. In an example, the VCO 14 may convert DC electric energy into AC electric energy by, but not limited to, self-excited oscillation, and continuously generate AC signals whose frequency values are controlled by a voltage-controlled voltage.

The programmable frequency divider 15 is configured to reduce the output signal frequency of the oscillator, to allow the output frequency, after being reduced to 1/N, to be compared with a reference signal frequency, so as to realize a phase-locked loop frequency doubling function.

It is to be understood that, the structure of the phase-locked loop main circuit 1 in FIG. 2 may be adjusted or configured flexibly, and specific implementation circuits of the modules in FIG. 2 may also be configured flexibly.

When the phase-locked loop main circuit 1 shown in FIG. 2 is applied to channels, the phase-locked loop main circuit 1 generates a phase shift as a result of a temperature change. When multiple channels each use a phase-locked loop main circuit 1, a phase difference between the channels is great as the temperature changes, which cannot meet a requirement for phase synchronization between the channels. Therefore, in this embodiment, a corresponding number of phase delay units 21 may be connected at corresponding positions of the phase-locked loop main circuits 1 shown in FIG. 2. The phase shift generated by the phase-locked loop main circuit 1 as a result of a temperature change is canceled out by the phase shift generated by the connected phase delay units 21 as a result of a temperature change, so that a phase shift finally outputted by the phase-locked loop main circuit 1 at different temperatures is 0 or slightly greater than 0. That is, an output phase of the phase-locked loop main circuit 1 is stabilized within a range that meets the requirement on phase synchronization. The implementation circuit is simple and easy to operate with small cost, and the characteristic of the phase-locked loop output phase varying with the temperature is improved significantly. Besides, when the phase-locked loop circuit according to this embodiment is applied to multiple channels, there is no need to perform detection and alignment control operations on phases between the channels, which improves resource utilization and saves energy consumption at the same time.

An overall linear proportional relation between phases and temperatures of parts of the phase-locked loop main circuit 1 is studied experimentally. To facilitate understanding, this embodiment is illustrated below by taking a phase shift represented by a phase temperature change slope as an example. The characteristic of phases varying with temperatures is called a phase and temperature change slope in this embodiment, which is expressed by a parameter K in unit of ps/° C. In this example, a total output phase and temperature change slope Kout of a transmission path on the phase-locked loop main circuit 1 and a total output phase and temperature change slope Koutc of the phase delay unit 21 connected to the phase-locked loop main circuit 1 on the transmission path satisfy the following relationships that:

When Kout is negative, Koutc is positive; when Kout is positive, Koutc is negative; and an absolute value of a sum of Kout and Koutc is less than or equal to a threshold K0. In this way, a last phase and temperature slope Klast of the phase-locked loop circuit can be maintained at about 0 after compensation by the phase delay unit 21 connected to the phase-locked loop main circuit 1. That is, Klast=|Kout+Koutc|≤*K*0.

It is to be understood that, the value of K0 in this example may be flexibly set based on specific application scenarios and application requirements. For example, the value of K0 may range from 0 ps/° C. to 0.5 ps/° C., and a specific value thereof may be flexibly set according to specific requirements.

Figure 3:
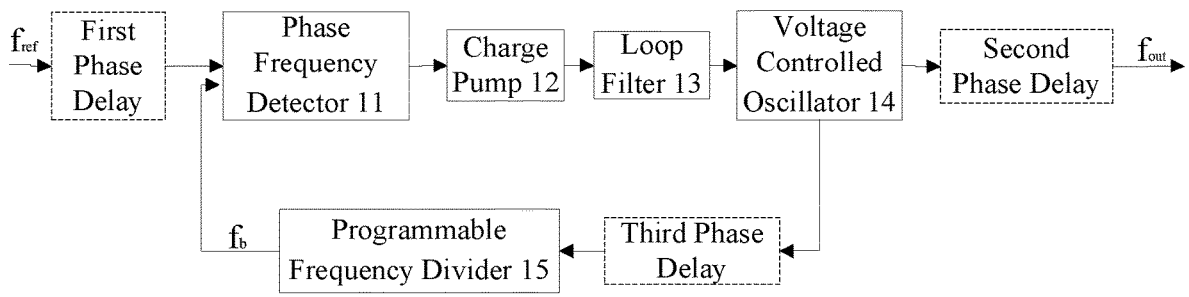
FIG. 3 is a schematic structural diagram of phase delay of the phase-locked loop main circuit according to Embodiment I of the present disclosure.

As can be known from the above analysis, a signal transmission phase of each module in the phase-locked loop main circuit 1 may change with the temperature. The phase-locked loop main circuit 1 may be mainly divided into four parts: a reference signal input path, a feedforward path, a feedback signal transmission path, and a signal output path. A transmission phase change of the feedforward path with temperature may not be reflected in a final output signal of a phase-locked loop, since a negative feedback mechanism of the phase-locked loop itself may calibrate it from time to time. As shown in FIG. 3, additional delays caused by phase change of the reference signal input path, the feedback signal transmission path, and the signal output path with temperature are represented by a first phase delay, a second phase delay, and a third phase delay, respectively. The phases of the reference signal input path, the feedback signal transmission path, and the signal output path increase with a temperature increase. That is, the phases are linearly proportional to the temperatures. The phases and the temperatures of the phase delay unit 21 are also linearly proportional to each other. Correspondingly, phase and temperature change slopes of the reference signal input path, the feedback signal transmission path, and the signal output path and a total output phase and temperature change slope of the phase delay unit currently connected to the phase-locked loop main circuit on the transmission path are K1, K2, K3, and Koutc, respectively.

In this embodiment, K1 of the reference signal input path and K2 of the signal output path play a role of superimposition on a final output phase temperature change, and K3 of the feedback signal transmission path plays a role of subtraction. Therefore, in this example, a total output phase and temperature change slope of the transmission path of the phase-locked loop main circuit 1 is Kout=K1+K2−K3.

Correspondingly, in this embodiment, phase and temperature change slopes of the phase delay unit 21 connected to the phase-locked loop main circuit 1 on the reference signal input path, the signal output path, and the feedback signal transmission path are set to Kc1, Kc2, and Kc3, respectively, and a total output phase and temperature change slope of the phase delay unit currently connected to the phase-locked loop main circuit on the transmission path is Koutc=Kc1+Kc2−Kc3.

When Kout is negative, Koutc is positive, and when Kout is positive, Koutc is negative, so that Kout and Koutc cancel each other out.

For example, in one scenario, when K1+K2 is much greater than K3, a corresponding adjustment threshold may be set. When K1+K2−K3 is greater than or equal to the adjustment threshold, for example, greater than 0.5, Kout=K1+K2−K3 is greater than 0.5, Koutc=Kc1+Kc2−Kc3 needs to be negative, and Klast=|Kout+Koutc|≤K0. When K0 is small, for example, near 0, the expression may also be: |Kout+Koutc|≈0. In this application scenario, Kc1+Kc2 is less than Kc3, so that Koutc is negative. In this case, Klast=Kout+Koutc. In an example, assuming that Kout=0.7 and Koutc=−0.5, Klast=0.7+(−0.5)=0.2. In another example, assuming that Kout=0.7 and Koutc=−0.7, Klast=0.7+(−0.7)=0, which is an optimal effect. In another example, assuming that Kout=0.7 and Koutc=−0.8, Klast=0.7+(−0.8)=−0.1. In this way, a first-order compensation for Kout is realized through Koutc, so that Klast finally outputted is 0 or a small positive or negative value.

In this application scenario, when Kout is positive, that is, Kout is greater than 0 and needs to be compensated, at least one of Kc1 and Kc2 may be set to 0 in an example. That is, the phase delay unit 21 is not connected to at least one of the reference signal input path and the signal output path. In this case, the phase delay unit 21 may not be provided for the path or a corresponding number of phase delay units 21 may be provided but not connected thereto. Thus, the use of the phase delay unit 21 is reduced, resource utilization is improved, and costs and complexity of control are reduced. In some other examples, both Kc1 and Kc2 may be set to 0. That is, no phase delay unit 21 is connected to the reference signal input path and the signal output path (in this case, no phase delay unit 21 is provided for the two paths or a corresponding number of phase delay units 21 may be provided but not connected thereto). In this case, the phase delay unit 21 is connected only to the feedback signal transmission path, and the number of the connected phase delay units 21 may be flexibly set according to Kout and K0.

For example, in another scenario, when K1+K2 is much less than K3, a corresponding adjustment threshold may also be set for representation and determination. When K3−K1+K2 is greater than or equal to the adjustment threshold, for example, greater than 1, Kout=K1+K2−K3 is less than −1. In this case, Koutc=Kc1+Kc2−Kc3 needs to be positive, and Klast=|Kout+Koutc|≤K0. When K0 is small, for example, near 0, the expression may also be: |Kout |−|Koutc|≈0. In this application scenario, Kc1+Kc2 is greater than Kc3, so that Koutc is positive. In this case, Klast=Kout+Koutc. In an example, assuming that Kout=−1 and Koutc=0.8, Klast=−1+0.8=−0.2. In another example, assuming that Kout=−1 and Koutc=1, Klast=−1+1=0, which is an optimal effect. In another example, assuming that Kout=−1 and Koutc=1.1, Klast=−1+1.1=0.1. In this way, a first-order compensation for Kout may also be realized through Koutc, so that Klast finally outputted is 0 or a small positive or negative value.

In this application scenario, when Kout is negative, that is, Kout is less than 0 and needs to be compensated, Kc3 may be set to 0 in an example. That is, no phase delay unit 21 is connected to the feedback signal transmission path (in this case, the phase delay unit 21 may not be provided for the path or a corresponding number of phase delay units 21 may be provided but not connected thereto). Thus, the use of the phase delay unit 21 is reduced, resource utilization is improved, and costs and complexity of control are reduced. In some other examples, either Kc1 or Kc2 may be set to 0. That is, no phase delay unit 21 is connected to the reference signal input path or the signal output path. In this case, the phase delay unit 21 may be or not be connected to the feedback signal transmission path. Certainly, in some examples, phase delay units 21 may be provided on the reference signal input path, the signal output path, and the feedback signal transmission path at the same time (in this case, Kc1, Kc2, and Kc3 are all greater than 0). Besides, the number of the connected phase delay units 21 may be flexibly set according to Kout and K0, provided that Koutc meets the above condition.

As can be known from the above analysis, in this embodiment, in order to eliminate a phase shift, the number of the phase delay units 21 to be connected to the phase-locked loop main circuit 1 and connection positions of the phase delay units 21 in the phase-locked loop main circuit 1 may be flexibly set according to specific application scenarios and requirements. Therefore, referring to FIG. 4, in some examples of this embodiment, the phase-locked loop circuit may further include a phase delay unit control module 3 configured to control, according to phase delay unit control parameters, a corresponding number of phase delay units 21 to be connected to the phase-locked loop main circuit 1. The phase delay unit control parameters are determined according to the phase shift generated by the phase-locked loop main circuit 1 as a result of a temperature change. In an example, it may be flexibly determined, according to the Kout, which of the reference signal input path, the signal output path, and the feedback signal transmission path needs a phase delay unit 21, and the number of the phase delay units 21 that need to be connected. Thus, the phase shift generated by the phase-locked loop main circuit as a result of the temperature change is canceled out by a phase shift generated by the connected phase delay unit of the phase temperature compensation circuit as a result of the temperature change, so as to ensure that the phase-locked loop circuit does not generate a phase shift as result of temperature change or only generates a phase shift in a small range during operation. When the phase-locked loop circuit according to this embodiment is applied to multi-channel scenarios, a phase difference between channels is minimized at all times since a temperature change causes no phase shift or only a phase shift in a small range in the phase-locked loop circuits of the channels during operation, thereby better meeting a requirement on phase synchronization of multi-channel communication fundamentally. Besides, detection and alignment control operations performed on phases between channels can be omitted, which improves resource utilization and saves energy consumption at the same time.

Embodiment II

Figure 5:
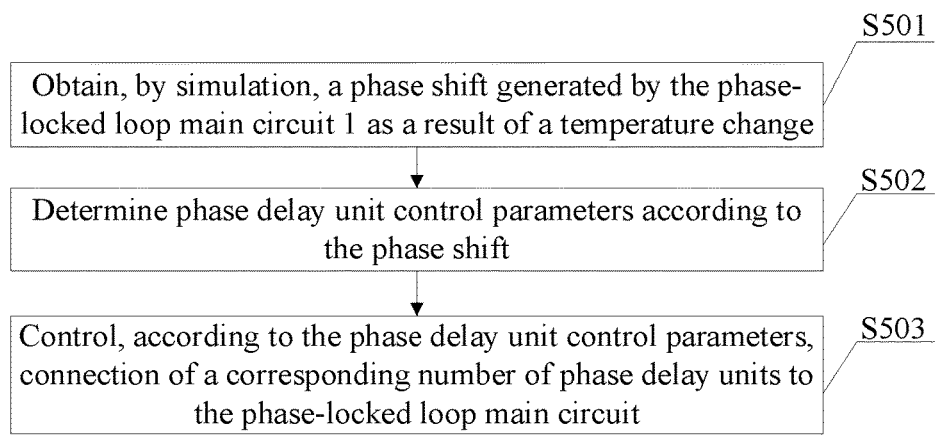
FIG. 5 is a schematic structural diagram of a configuration method for a phase-locked loop circuit according to Embodiment II of the present disclosure.

For ease of understanding, in this embodiment, a method for configuring the phase-locked loop circuit shown in Embodiment I is illustrated below on the basis of Embodiment I. Referring to FIG. 5, the method includes steps S501 to S503.

At S501, a phase shift generated by the phase-locked loop main circuit as a result of a temperature change is obtained by simulation.

In an example, phase and temperature change slopes K1, K2, and K3 of the reference signal input path, the feedback signal transmission path, and the signal output path may be obtained by simulation based on collected data, so as to obtain a total output phase and temperature change slope of a transmission path of the phase-locked loop main circuit 1, i.e., Kout=K1+K2−K3.

At S502, phase delay unit control parameters are determined according to the phase shift. In an example, it may be determined, according to Kout=K1+K2−K3, which of the reference signal input path, the feedback signal transmission path, and the signal output path needs a phase delay unit 21; and the number of the phase delay units 21 that needs to be connected. That is, in an example, the phase delay unit control parameters include which path needs a phase delay unit 21 and the number of the phase delay units 21 that need to be connected.

At S503, a corresponding number of phase delay units to be connected to the phase-locked loop main circuit are controlled according to the phase delay unit control parameters.

For example, the phase delay unit control parameters may include high and low levels, and the high and low levels control, through a control switch, a corresponding phase delay unit lock connected to the phase temperature compensation circuit, so that a corresponding number of phase delay units can be connected at corresponding positions in a simulation stage.

It is to be understood that, in this embodiment, the specific structure of the phase delay unit control module 3 and the total number of the phase delay units 21 may be flexibly set as required.

Figure 6:
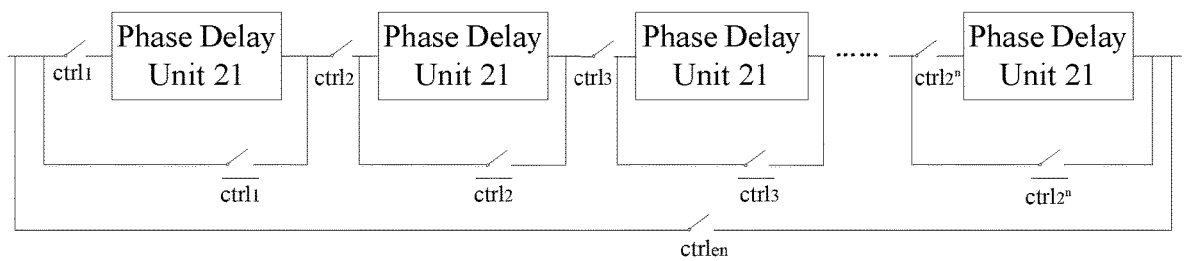
FIG. 6 is a schematic structural diagram of a phase temperature compensation circuit according to Embodiment II of the present disclosure.

For example, an exemplary phase temperature compensation circuit, as shown in FIG. 6, includes multiple phase delay units 21 which are connected to the circuit through transmission gate logic to form the phase temperature compensation circuit. Each phase delay unit 21 may include a circuit of two or more stages of inverters, as shown in FIG. 7, or may include a transmission gate unit, an RC delay unit, a simple resistor unit, etc., as shown in FIG. 8-1, FIG. 8-2, and FIG. 8-3 respectively; and certainly, may also be implemented through other circuit structures.

In another example, the structure of the phase delay unit control module 3 is shown in FIG. 9, including a decoding circuit and a transmission gate control logic circuit. The decoding circuit may convert input signals such as v1, v2, . . . , and vn into $2^n$ high and low level control signals ctrl1, ctrl2, . . . , and ctrl$2^n$. The control signals are connected to the transmission gate control logic directly or through an inverter, and then controls the phase delay unit 21 of the phase temperature compensation circuit to be connected to the phase-locked loop main circuit.

In some other application scenarios of this embodiment, after the phase-locked loop circuit is configured based on the simulation result, the following calibration process may also be included, so as to further improve accuracy and reliability of control. The calibration process according to this embodiment may include:

acquiring a last phase and temperature change slope Klast outputted after the phase shift generated by the phase delay unit connected to the phase-locked loop main circuit as a result of a temperature change and the phase shift generated by the phase-locked loop main circuit as a result of a temperature change cancel each other out; and determining, according to the last phase shift Klast, a number m of phase delay units that need to be connected to or disconnected from the phase-locked loop main circuit, and correspondingly connecting m phase delay units to the phase-locked loop main circuit, or disconnecting m phase delay units 21 among the currently connected phase delay units from the phase-locked loop main circuit.

Figure 10:
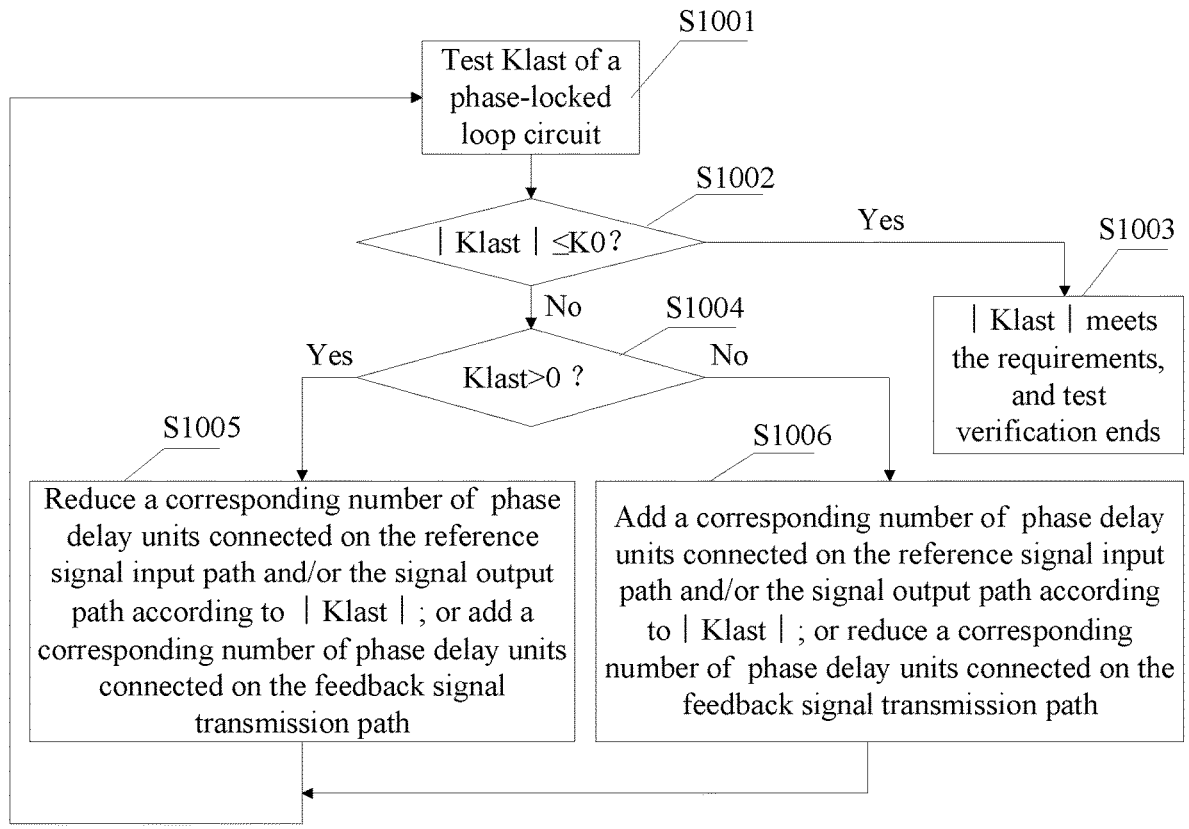
FIG. 10 is a schematic diagram of a calibration process of a phase-locked loop circuit according to Embodiment II of the present disclosure.

The calibration process in this embodiment may be, but is not limited to, test and calibration in a chip delivery stage. For ease of understanding, this embodiment is illustrated below by a test and calibration process in the chip delivery stage, which, as shown in FIG. 10, includes steps S1001 to S1006.

At S1001, a last phase and temperature change slope Klast of the phase-locked loop circuit is tested.

At S1002: |Klast|≤K0? (That is, whether |Klast| is less than or equal to K0); if yes, S1003 is performed; otherwise, S1004 is performed.

At S1003, |Klast| meets the requirements, and test verification ends.

At S1004, Klast>0? (That is, whether |Klast| is greater than 0); if yes, S1005 is performed; otherwise, S1006 is performed.

At S1005, a corresponding number of connected phase delay units are disconnected from the reference signal input path and/or the signal output path according to |Klast|; or a corresponding number of phase delay units are connected in the feedback signal transmission path, and then S1001 is performed.

At S1006, a corresponding number of phase delay units are connected in the reference signal input path and/or the signal output path according to |Klast|; or a corresponding number of connected phase delay units are disconnected from the feedback signal transmission path, and then S1001 is performed.

In an application scenario, when the phase-locked loop circuit is disposed in a chip or leaves factory in the form of a separate device, the calibration process shown in FIG. 10 may be performed. For example, Klast of a current phase of the phase-locked loop circuit may be tested at high and low temperatures, respectively, and then it is judged whether |Klast| is small enough to meet the application requirement. If yes, the calibration ends, and if no, it is further judged whether Klast is greater than 0. If Klast is greater than 0, the number of phase delay units connected to the reference signal input path and/or the output path is appropriately reduced or the number of phase delay units connected to the feedback signal transmission path is added according to |Klast|. If Klast is less than 0, the number of phase delay units connected to the reference signal input path and/or the output path is appropriately added or the number of phase delay units connected to the feedback signal transmission path is reduced according to |Klast|. Then, the above verification process is repeated until |Klast| meets the requirement.

In an example of this embodiment, for a phase-locked loop circuit, a set of fixed phase delay unit control parameters may be obtained through the processes shown in FIG. 5 and FIG. 10 based on phase and temperature change slopes corresponding to the highest and lowest temperature intervals under an operating environment. The phase delay unit control parameters include which path needs the phase delay unit and the number of phase delay units to be connected to the paths. In this example, the phase delay unit control module may control, based on the fixed phase delay unit control parameters, a corresponding number of phase delay units to be connected to the corresponding path, which may be unchanged after leaving the factory.

In another example of this embodiment, for a phase-locked loop circuit, multiple temperature intervals may be classified based on the highest and lowest temperatures under an operating environment, and a set of phase delay unit control parameters corresponding to a respective one of the temperature intervals, that is, one set of phase delay unit control parameters corresponding to one temperature interval, may be obtained based on a test result. During the operation, the phase delay unit control module may acquire a current temperature, and when determining that the current temperature falls within another target temperature interval, dynamically control, based on the phase delay unit control parameters corresponding to the target temperature interval, a corresponding number of phase delay units to be connected to the corresponding path.

In addition, for ease of understanding, the structure of the phase-locked loop circuit according to this embodiment is illustrated below with an example in which several cases before and after modification are compared.

Figures 1, 11:
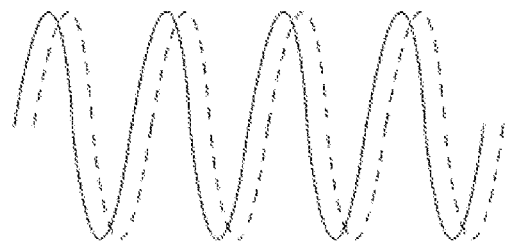
Figures 2, 11:
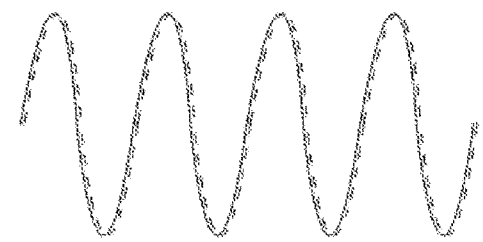
Figures 3, 11:
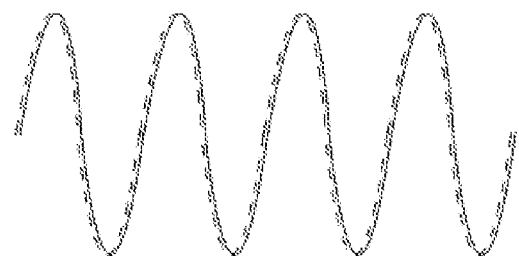
Figures 4, 11:
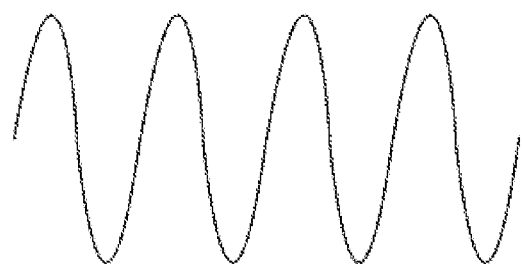

FIG. 11-1 shows output phases varying with temperatures when the phase-locked loop main circuit is uncompensated. As can be seen, the phase varies greatly with the temperatures, which fails to meet communication requirements. Waveform phases outputted by the phase-locked loop circuit according to this embodiment may vary with temperatures in the following three ways.

Undercompensation: referring to FIG. 11-2, in this case, Klast is a small value greater than 0, and the phase finally outputted by the phase-locked loop circuit slights increases with a temperature increase.

Overcompensation: referring to FIG. 11-3, in this case, Klast is a small value greater than 0, and the phase finally outputted by the phase-locked loop circuit slights decreases with a temperature increase.

Figure 4:
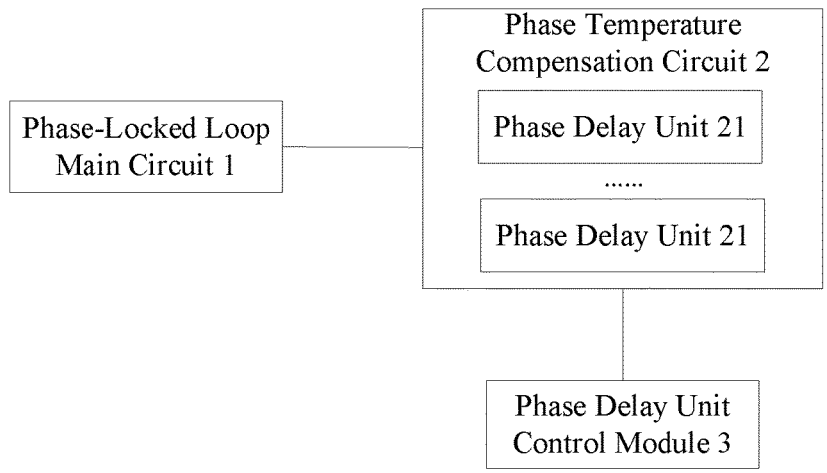
FIG. 4 is a schematic structural diagram of another phase-locked loop circuit according to Embodiment I of the present disclosure.

Ideal compensation: referring to FIG. 11-4, in this case, Klast is a value equal to 0, and when the temperature increases or decreases, the phase outputted by the phase-locked loop circuit remains unchanged.

Figure 12:
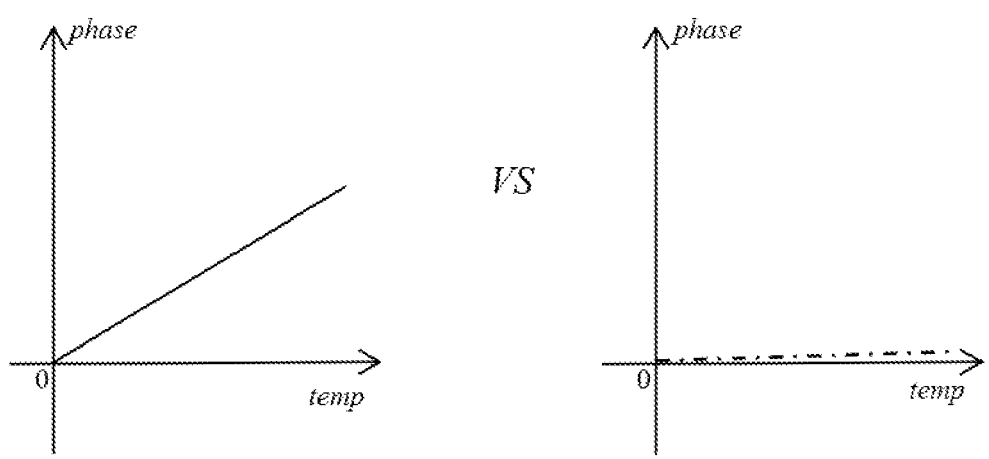
FIG. 12 is a schematic diagram of comparison between undercompensation and uncompensation according to Embodiment II of the present disclosure.

The following description is provided by taking comparisons between phase and temperature change slopes finally outputted by the phase-locked loop circuit corresponding to the two cases depicted in FIG. 11-1 and FIG. 11-2. Referring to FIG. 12, the coordinate system on the left is the phase and temperature change slope corresponding to FIG. 11-1, and the coordinate system on the right is the phase and temperature change slope corresponding to FIG. 11-2. As can be seen, the slope of the output phase varying with the temperature after calibration is much smaller than that of the uncalibrated phase-locked loop circuit.

Embodiment III

For ease of understanding, this embodiment is illustrated below by taking several application scenarios as an example.

Application Scenario I

In this application scenario, referring to FIG. 13-2 to FIG. 13-4, phase and temperature change slopes of the reference signal input path, the signal output path, and the feedback signal transmission path are in a relation of K1+K2−K3>0. If no phase delay unit is connected, a phase finally outputted by the phase-locked loop circuit increases with a temperature increase. In this embodiment, a corresponding number of phase delay units connected to the feedback signal transmission path generate a corresponding Kc3. Referring to FIG. 13-1 and FIG. 13-5, no phase delay unit is currently connected to the reference signal input path and the signal output path. Output phases of the connected phase delay units increase with a temperature increase. Due to an inherent property that an increase in delay of the phase of the feedback signal transmission path of the phase-locked loop circuit may lead to a decrease in delay of the output phase of the phase-locked loop circuit, the connected phase delay units may finally mitigate, by means of simulation calibration or offline calibration, the property that the output phase of the phase-locked loop increases with a temperature increase, that is, Klast=K1+K2−K3−Kc3. In this application scenario, the phase delay unit control module may control, by means of simulation calibration or offline calibration shown in FIG. 5 and FIG. 10, a corresponding number of phase delay units to be connected to the feedback signal transmission path to adjust the coefficient Kc3. Under the effect of Kc3, Klast=K1+K2−K3−Kc3≈0 is realized. Refer to FIG. 13-6 for a diagram of comparison between K1, K2, K3, and Kc3. Refer to FIG. 13-7 for Klast obtained after cancellation. In this case, the output phase of the phase-locked loop circuit slightly increases with a temperature increase, but is much less than K1+K2−K3.

Application Scenario II

Figures 1, 14:
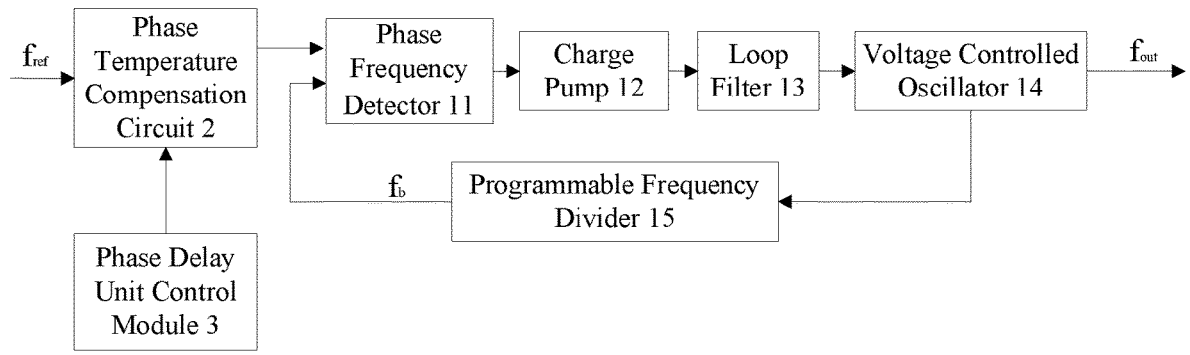
Figures 2, 14:
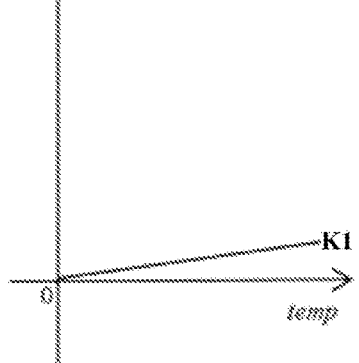
Figures 3, 14:
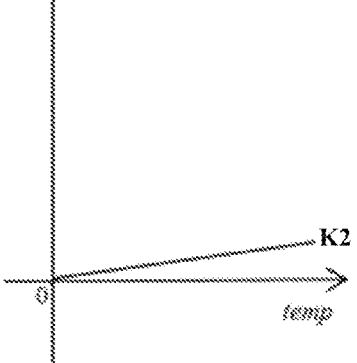
Figures 4, 14:
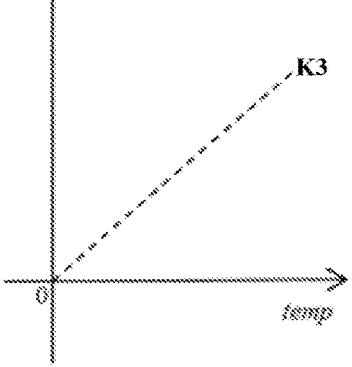
Figures 5, 14:
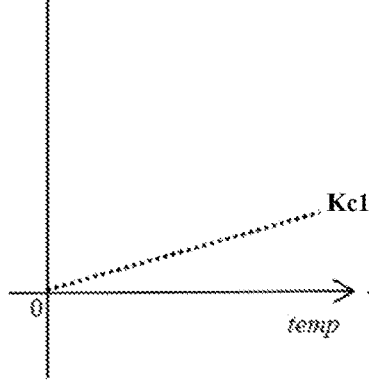
Figures 6, 14:
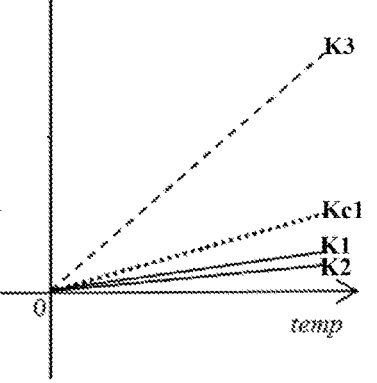
Figures 7, 14:
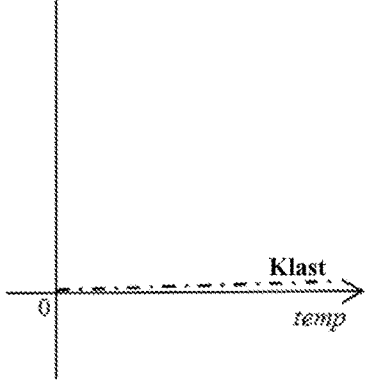

In this application scenario, referring to FIG. 14-2 to FIG. 14-4, phase and temperature change slopes of the reference signal input path, the signal output path, and the feedback signal transmission path are in a relation of K1+K2−K3<0. If no phase delay unit is connected, a phase finally outputted by the phase-locked loop circuit decreases with a temperature increase. In this embodiment, a corresponding number of phase delay units connected to the reference signal input path generate a corresponding Kc1. Referring to FIG. 14-1 and FIG. 14-5, no phase delay unit is currently connected to the signal output path and the feedback signal transmission path (or phase delay units may also be connected as required). Output phases of the connected phase delay units increase with a temperature increase. Due to an inherent property that an increase in delay of the phase of the reference signal input path of the phase-locked loop circuit may lead to an increase in delay of the output phase of the phase-locked loop circuit, the connected phase delay units may finally mitigate, by means of simulation calibration or offline calibration, the property that the output phase of the phase-locked loop decreases with a temperature increase, that is, Klast=K1+K2−K3+Kc1. In this application scenario, the phase delay unit control module may control, by means of simulation calibration or offline calibration shown in FIG. 5 and FIG. 10, a corresponding number of phase delay units to be connected to the reference signal input path to adjust the coefficient Kc1. Under the effect of Kc1, Klast=K1+K2−K3+Kc1≈0 is realized. Refer to FIG. 14-6 for a diagram of comparison between K1, K2, K3, and Kc1. Refer to FIG. 14-7 (a schematic diagram of undercompensation) for Klast obtained after cancellation.

Application Scenario III

In this application scenario, referring to FIG. 15-1 to FIG. 15-3, phase and temperature change slopes of the reference signal input path, the signal output path, and the feedback signal transmission path are in a relation of K1+K2−K3<0. If no phase delay unit is connected, a phase finally outputted by the phase-locked loop circuit decreases with a temperature increase. In this embodiment, a corresponding number of phase delay units connected to the reference signal input path generate a corresponding Kc1. Referring to FIG. 15-4, no phase delay unit is currently connected to the signal output path and the feedback signal transmission path (or phase delay units may also be connected as required). Output phases of the connected phase delay units increase with a temperature increase. Due to an inherent property that an increase in delay of the phase of the reference signal input path of the phase-locked loop circuit may lead to an increase in delay of the output phase of the phase-locked loop circuit, the connected phase delay units may finally mitigate, by means of simulation calibration or offline calibration, the property that the output phase of the phase-locked loop decreases with a temperature increase, that is, Klast=K1+K2−K3+Kc1. In this application scenario, the phase delay unit control module may control, by means of simulation calibration or offline calibration shown in FIG. 5 and FIG. 10, a corresponding number of phase delay units to be connected to the reference signal input path to adjust the coefficient Kc1. Under the effect of Kc1, Klast=K1+K2−K3+Kc1≈0 is realized. Refer to FIG. 15-5 for a diagram of comparison between K1, K2, K3, and Kc1. Refer to FIG. 15-6 (a schematic diagram of overcompensation) for Klast obtained after cancellation. In this case, the output phase of the phase-locked loop slightly decreases with a temperature increase.

Application Scenario IV

In this application scenario, referring to FIG. 16-2 to FIG. 16-4, phase and temperature change slopes of the reference signal input path, the signal output path, and the feedback signal transmission path are in a relation of K1+K2−K3<0. If no phase delay unit is connected, a phase finally outputted by the phase-locked loop circuit decreases with a temperature increase. In this embodiment, a corresponding number of phase delay units connected to the signal output path generate a corresponding Kc2. Referring to FIG. 16-1 and FIG. 16-5, no phase delay unit is currently connected to the reference signal input path and the feedback signal transmission path (or phase delay units may also be connected as required). Output phases of the connected phase delay units increase with a temperature increase. Due to an inherent property that an increase in delay of the phase of the reference signal input path of the phase-locked loop circuit may lead to an increase in delay of the output phase of the phase-locked loop circuit, the connected phase delay units may finally mitigate, by means of simulation calibration or offline calibration, the property that the output phase of the phase-locked loop decreases with a temperature increase, that is, Klast=K1+K2−K3+Kc2. In this application scenario, the phase delay unit control module may control, by means of simulation calibration or offline calibration shown in FIG. 5 and FIG. 10, a corresponding number of phase delay units to be connected to the signal output path to adjust the coefficient Kc2. Under the effect of Kc2, Klast=K1+K2−K3+Kc2≈0 is realized. Refer to FIG. 16-6 for a diagram of comparison between K1, K2, K3, and Kc2. Refer to FIG. 16-7 for Klast obtained after cancellation. In this case, the output phase of the phase-locked loop slightly increases with a temperature increase, but is much less than K1+K2−K3.

Embodiment IV

This embodiment further provides a communication device, which may be, but is not limited to, a base station or a variety of transceivers, and includes at least one phase-locked loop circuit shown in the above embodiment. In an example, when the communication device adopts multi-channel communication, one channel may use one phase-locked loop circuit, or multiple channels may share one phase-locked loop circuit.

For ease of understanding, in an example of this embodiment, the communication device is illustrated as a base station. Moreover, it is to be understood that the base station in this embodiment may be a cabinet macro base station, a distributed base station or a multi-mode base station. Referring to FIG. 17, the base station in this example includes a Building Base band Unit (BBU) 171, a Radio Remote Unit (RRU) 172, and an antenna 173.

The BBU 171 is responsible for centralized control and management of an entire base station system, completing uplink and downlink base band processing functions, and providing physical interfaces with radio frequency units and transmission networks to complete information interaction. According to different logical functions, as shown in FIG. 17, the BBU 171 may include a base band processing unit 1712, a main control unit 1711, a transmission interface unit 1713, etc. In some embodiments, the main control unit 1711 mainly implements control management, signaling processing, data transmission, interactive control, system clock supply and other functions of the BBU. The base band processing unit 1712 is configured to complete base band protocol processing such as signal coding modulation, resource scheduling, and data encapsulation, and provide an interface between the BBU and the RRU. The transmission interface unit 1713 is configured to provide a transmission interface for connection to a core network. In this example, the logical function units may be distributed on different physical boards or integrated on the same board. Moreover, optionally, the BBU 171 may adopt base band master control integration or base band master control separation. For the base band master control integration, master control, transmission, and base band are integrally designed. That is, the base band processing unit is integrated with the master control unit and the transmission interface unit on a physical board. This architecture has higher reliability, lower latency, higher resource sharing and scheduling efficiency, and lower power consumption. For the base band master control separation, the base band processing unit and the master control unit are distributed on different boards, corresponding to a base band board and a master control board. The split architecture supports free combinations between boards, facilitating flexible base band expansion. This may be specifically set as required.

The RRU 172 communicates with the BBU through a base band radio frequency interface to convert base band signals to radio frequency signals. Referring to FIG. 17, an exemplary RRU 172 mainly includes an interface unit 1721, an uplink signal processing unit 1724, a downlink signal processing unit 1722, a power amplifier unit 1723, a low noise amplifier unit 1725, a duplexer unit 1726, etc., which constitute a downlink signal processing link and an uplink signal processing link. In some embodiments, the interface unit 1721 provides a forwarding interface with the BBU to receive and send base band IQ signals. The downlink signal processing unit 1722 performs signal processing functions such as up conversion, digital-to-analog conversion and radio frequency modulation. The uplink signal processing unit 1724 mainly performs functions such as signal filtering, mixing, analog-to-digital conversion and down conversion. The power amplifier unit 1723 is configured to amplify a downlink signal and then send it through the antenna 173. The low noise amplifier unit 1725 is configured to amplify a received uplink signal and then send it to the uplink signal processing unit 1724 for processing. The duplexer unit 1726 supports multiplexing and filtering of transceiver signals.

In addition, it is to be understood that the base station in this embodiment may also be of Central Unit (CU)-Distributed Unit (DU) architecture. DU is a distributed access point configured to implement underlying baseband protocols and radio frequency processing functions. CU is a central unit configured to process high-level protocol functions and centrally manage multiple DUs. CU and DU jointly complete base band and radio frequency processing functions of the base station.

Thus, those having ordinary skills in the art should understand that all or some of the steps in the method disclosed above, the functional modules/units in the systems, and the apparatuses may be implemented as software (which may be implemented using computer program code executable by a computing device), firmware, hardware, and appropriate combinations thereof. In hardware implementations, the division between functional modules/units mentioned in the above description does not necessarily correspond to the division of physical components. For example, a physical component may have multiple functions, or a function or step may be performed by several physical components in cooperation. Some or all physical components may be implemented as software executed by processors, such as central processing units, digital signal processors, or microprocessors, or as hardware, or as integrated circuits, such as application-specific integrated circuits.

In addition, it is well known to those having ordinary skills in the art that a communication medium generally includes computer-readable instructions, data structures, computer program modules, or other data in a modulated data signal such as a carrier or other transmission mechanisms, and may include any information delivery medium. Therefore, the present disclosure is not limited to any particular combination of hardware and software.

The above contents are further detailed descriptions of the present disclosure in combination with specific implementations, and the specific implementations of the present disclosure shall not be deemed to be limited to these descriptions. Those having ordinary skills in the art can also make some simple deductions or substitutions without departing from the idea of the present disclosure, which should be regarded as falling within the protection scope of the present disclosure.

INDUSTRIAL APPLICABILITY

Based on the above technical schemes according to the embodiments of the present disclosure, a phase-locked loop circuit includes a phase-locked loop main circuit and a phase temperature compensation circuit. According to a phase shift generated by the phase-locked loop main circuit as a result of a temperature change, at least one phase delay unit of the phase temperature compensation circuit may be connected to the phase-locked loop main circuit, and a phase shift generated by the connected phase delay unit of the phase temperature compensation circuit as a result of the temperature change is used to cancel out the phase shift generated by the phase-locked loop main circuit as a result of the temperature change, thus ensuring that the phase-locked loop circuit does not generate a phase shift as result of a temperature change or only generates a phase shift in a small range during operation. In this way, when the phase-locked loop circuit is applied to multi-channel scenarios, a phase difference between channels is minimized at all times since a temperature change causes no phase shift or only a phase shift in a small range in the phase-locked loop circuits of the channels during operation, thereby better meeting a requirement on phase synchronization of multi-channel communication fundamentally. Besides, phase detection and alignment control operations performed between channels can be omitted, which improves resource utilization and saves energy consumption at the same time.

The invention claimed is:

1. A phase-locked loop circuit, comprising a phase-locked loop main circuit and a phase temperature compensation circuit, the phase temperature compensation circuit comprising at least one phase delay unit connected to the phase-locked loop main circuit and configured to generate a phase shift as a result of a temperature change for cancelling out a phase shift generated by the phase-locked loop main circuit as a result of a temperature change;

wherein a total output phase and temperature change slope Kout of a transmission path on the phase-locked loop main circuit and a total output phase and temperature change slope Koutc of the phase delay unit connected to the phase-locked loop main circuit on the transmission path satisfy:

Koutc being positive in response to Kout being negative, Koutc being negative in response to Kout being positive, and an absolute value of a sum of Kout and Koutc being less than or equal to a threshold K0.

2. The phase-locked loop circuit of claim 1, wherein the transmission path comprises a reference signal input path, a signal output path and a feedback signal transmission path, of which phase and temperature change slopes are K1, K2 and K3, respectively, and Kout=K1+K2−K3; and phase and temperature change slopes of the phase delay unit connected to the phase-locked loop main circuit on the reference signal input path, the signal output path and the feedback signal transmission path are Kc1, Kc2 and Kc3, respectively, and Koutc=Kc1+Kc2−Kc3.

3. The phase-locked loop circuit of claim 2, wherein at least one of Kc1 and Kc2 is 0 in response to Kout being positive.

4. The phase-locked loop circuit of claim 3, wherein Kc1 and Kc2 are 0 in response to Kout being positive.

5. The phase-locked loop circuit of claim 2, wherein Kc3 is 0 in response to Kout being negative.

6. The phase-locked loop circuit of claim 2, wherein Kc1 or Kc2 is 0 in response to Kout being negative.

7. The phase-locked loop circuit of claim 1, further comprising a phase delay unit control module configured to control, according to phase delay unit control parameters, connection of a corresponding number of phase delay units to the phase-locked loop main circuit, wherein the phase delay unit control parameters are determined according to the phase shift generated by the phase-locked loop main circuit as a result of a temperature change.

8. A method for configuring a phase-locked loop circuit, the phase-locked loop circuit comprising a phase-locked loop main circuit and a phase temperature compensation circuit, the phase temperature compensation circuit comprising at least one phase delay unit connected to the phase-locked loop main circuit and configured to generate a phase shift as a result of a temperature change for cancelling out a phase shift generated by the phase-locked loop main circuit as a result of a temperature change;

wherein a total output phase and temperature change slope Kout of a transmission path on the phase-locked loop main circuit and a total output phase and temperature change slope Koutc of the phase delay unit connected to the phase-locked loop main circuit on the transmission path satisfy: Koutc being positive in response to Kout being negative, Koutc being negative in response to Kout being positive, and an absolute value of a sum of Kout and Koutc being less than or equal to a threshold K0; the method comprising:

obtaining, by simulation, a phase shift generated by the phase-locked loop main circuit as a result of a temperature change;

determining phase delay unit control parameters according to the phase shift; and controlling, according to the phase delay unit control parameters, connection of a corresponding number of phase delay units to the phase-locked loop main circuit.

9. The method of claim 8, after controlling, according to the phase delay unit control parameters, connection of a corresponding number of phase delay units to the phase-locked loop main circuit, further comprising a calibration process comprising:

acquiring a last phase shift outputted after the phase shift generated by the phase delay unit connected to the phase-locked loop main circuit as a result of a temperature change and the phase shift generated by the phase-locked loop main circuit as a result of a temperature change cancel each other out; and determining, according to the last phase shift, a number m of phase delay units to be connected to or disconnected from the phase-locked loop main circuit, and correspondingly connecting m phase delay units the phase-locked loop main circuit, or disconnecting m phase delay units among the currently connected phase delay units from the phase-locked loop main circuit.

10. A communication device, comprising at least one phase-locked loop circuit, the at least one phase-locked loop circuit comprising a phase-locked loop main circuit and a phase temperature compensation circuit, the phase temperature compensation circuit comprising at least one phase delay unit connected to the phase-locked loop main circuit and configured to generate a phase shift as a result of a temperature change for cancelling out a phase shift generated by the phase-locked loop main circuit as a result of a temperature change, wherein a total output phase and temperature change slope Kout of a transmission path on the phase-locked loop main circuit and a total output phase and temperature change slope Koutc of the phase delay unit connected to the phase-locked loop main circuit on the transmission path satisfy: Koutc being positive in response to Kout being negative, Koutc being negative in response to Kout being positive, and an absolute value of a sum of Kout and Koutc being less than or equal to a threshold K0.

* * * * *